(12) United States Patent
Majumdar et al.

(10) Patent No.: US 7,235,857 B2
(45) Date of Patent: Jun. 26, 2007

(54) POWER SEMICONDUCTOR DEVICE

(75) Inventors: Gourab Majumdar, Tokyo (JP); Shinji Hatae, Tokyo (JP); Akihisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 138 days.

(21) Appl. No.: 10/467,344

(22) PCT Filed: May 25, 2001

(86) PCT No.: PCT/JP01/04383

§ 371 (c)(1),
(2), (4) Date: Aug. 20, 2003

(87) PCT Pub. No.: WO02/097888

PCT Pub. Date: Dec. 5, 2002

(65) Prior Publication Data
US 2004/0070047 A1 Apr. 15, 2004

(51) Int. Cl.
H01L 29/00 (2006.01)
H01L 27/01 (2006.01)

(52) U.S. Cl. .................. 257/510; 257/77; 257/369; 257/371; 257/512

(58) Field of Classification Search ........ 257/510–512, 257/77, 525, 289, 369, 371; 438/105, 931
See application file for complete search history.

(56) References Cited

U.S. PATENT DOCUMENTS

| 5,241,211 | A | * | 8/1993 | Tashiro | 257/506 |
| 5,614,743 | A | * | 3/1997 | Mochizuki | 257/276 |
| 5,661,329 | A | * | 8/1997 | Hiramoto et al. | 257/510 |
| 5,763,922 | A | * | 6/1998 | Chau | 257/371 |
| 5,977,564 | A |  | 11/1999 | Kobayashi et al. |  |
| 5,985,708 | A | * | 11/1999 | Nakagawa et al. | 438/206 |
| 6,133,587 | A | * | 10/2000 | Takeuchi et al. | 257/77 |
| 6,150,708 | A | * | 11/2000 | Gardner et al. | 257/618 |
| 6,310,385 | B1 | * | 10/2001 | Ajit | 257/524 |
| 6,392,859 | B1 | * | 5/2002 | Ohshima | 361/100 |
| 6,423,987 | B1 | * | 7/2002 | Constapel et al. | 257/173 |
| 6,518,144 | B2 | * | 2/2003 | Minato et al. | 438/424 |
| 6,642,599 | B1 | * | 11/2003 | Watabe et al. | 257/509 |
| 2001/0045615 | A1 | * | 11/2001 | Ajit | 257/523 |
| 2002/0040994 | A1 | * | 4/2002 | Nitta et al. | 257/328 |
| 2003/0104681 | A1 | * | 6/2003 | Davari et al. | 438/480 |
| 2005/0006716 | A1 | * | 1/2005 | Kumar et al. | 257/500 |
| 2006/0102960 | A1 | * | 5/2006 | Masleid | 257/371 |

FOREIGN PATENT DOCUMENTS

| EP | 887854 | * | 12/1998 |
| JP | 6-100469 | * | 6/1985 |
| JP | 1-253265 | * | 10/1989 |
| JP | 8-88283 | * | 4/1996 |
| JP | 11177082 | * | 7/1999 |
| JP | 2002-314082 | * | 10/2002 |

* cited by examiner

Primary Examiner—Sue A. Purvis
Assistant Examiner—Ahmed N. Sefer
(74) Attorney, Agent, or Firm—Oblon, Spivak, McClelland, Maier & Neustadt, P.C.

(57) ABSTRACT

A semiconductor device is provided in which a plurality of MOSFETs including a vertical MOSFET is formed on a substrate. The device includes a silicon carbide substrate having front and back surfaces facing each other, an isolating region formed in the substrate to extend from the front surface to the back surface of the substrate, and first and second MOSFETs formed on opposite sides of the isolating region, respectively.

4 Claims, 3 Drawing Sheets

POWER SEMICONDUCTOR DEVICE

FIELD OF THE INVENTION

The present invention relates to a power semiconductor device and, more particularly, to a power semiconductor device using a vertical power MOSFET.

BACKGROUND OF THE INVENTION

FIG. 6 is a cross-sectional view of an n-channel vertical power MOSFET, generally denoted at 200, using a silicon substrate.

An n-type epitaxial layer 202 is formed on an n-type silicon substrate 201. Two p-type body regions 203 are formed in the epitaxial layer 202 by diffusion method. Also, an n-type doped layer 204 is formed in the each body region 203.

A source electrode 205 is formed on the n-type doped region 204. A gate electrode 207 is formed on the body region 203 provided between the epitaxial layer 202 and the n-type doped region 204 through an insulating layer 206. Also, a drain electrode 208 is formed on the back surface of the n-type silicon substrate 201.

In the vertical power MOSFET 200, the current flowing from the drain electrode 208 to the source electrode 205 is controlled by the voltage supplied to the gate electrode 207.

In the vertical power MOSFET 200, the withstand voltage between the source and drain electrodes is determined by the avalanche voltage of the pn junction between the p-type body region 203 and the epitaxial layer 202. Therefore, a limitation exists in the reduction of thickness of both body region 203 and epitaxial layer 202, because the avalanche breakdown increases as the voltage applied to the pn junction becomes larger. Consequently, the thickness of the vertical power MOSFET 200 is generally determined to about 600 μm.

On the other hand, an electrical isolation is needed between adjacent vertical power MOSFETs by forming an isolating region extending from the front surface to the back surface of the MOSFET, when a power semiconductor device having two vertical power MOSFETs of p-channel and n-channel formed together on the same substrate is formed. The isolating region is formed by the process of forming a trench which extends from the front surface of the MOSFET to the back surface of the substrate, and then filling the trench by silicon oxide or the like.

However, forming the narrow trench having the depth equal to the thickness of the MOSFET, e.g. 600 μm, is difficult. Consequently, it is difficult to form a plurality of vertical power MOSFETs on the same substrate, and therefore, the power semiconductor device is constructed of a plurality of vertical power MOSFETs which are individually fabricated.

SUMMARY OF THE INVENTION

The object of the present invention is to provide a power semiconductor devise fabricated by forming a plurality of MOSFETs including a vertical power MOSFET on the same substrate.

It is noticed that the breakdown voltage of silicon carbide (SiC) is about ten times that of silicon, and the band gap of silicon carbide is from twice to three times that of Silicon. As a result, it has been found that the thickness of a vertical power MOSFET can be made much thinner by using a silicon carbide substrate instead of a silicon substrate, thus completing the present invention.

That is, the present invention provides a semiconductor device having a plurality of MOSFETs, including a vertical MOSFET, formed on a substrate, including: a silicon carbide substrate having front and back surfaces facing each other; an isolating region formed in the substrate to extend from the front surface to the back surface of the substrate; and first and second MOSFETs formed on opposite sides of the isolating region, respectively.

By using the silicon carbide substrate instead of a silicon substrate, the breakdown voltage and the band gap of the device becomes respectively ten times and from twice to third times that of a device using a silicon substrate. Consequently, the thickness of the MOSFET can be sufficiently smaller than that of a MOSFET using a silicon substrate, without decreasing the breakdown voltage of the pn junction between the substrate and the body region. Hereby, an isolating region can be formed easily between the adjacent MOSFETs, and a plurality of MOSFETs including a vertical MOSFET can be formed on the same substrate. Thereby, a downsized and integrated power semiconductor device can be provided.

The present invention also provides a semiconductor device characterized in that the first MOSFET is a vertical MOSFET including the silicon carbide substrate of the first conductivity type; a body region of second conductivity type formed on the front side of the silicon carbide substrate; and a doped region of first conductivity type formed in the body region, and the second MOSFET is a vertical MOSFET including the silicon carbide substrate of second conductivity type; a body region of first conductivity type formed on the front side of the silicon carbide substrate; and a doped region of second conductivity type formed in the body region, wherein the current flowing between the silicon carbide substrate and the doped region is controlled by a gate electrode formed on the body region in the each vertical MOSFET.

According to the present invention, two vertical MOSFETs described above can be formed on the same silicon carbide substrate.

The silicon carbide substrate of the first MOSFET may include a region with high concentration of first conductivity type impurities in the back side of the substrate, and the silicon carbide substrate of the second MOSFET may include a region with high concentration of second conductivity type impurities in the back side of the substrate.

Good ohmic contact can be obtained between the silicon carbide substrate and the drain electrode by forming such regions with impurities of high concentration.

Furthermore, the common drain electrode for the first and second MOSFETs may be formed on the back surface of the silicon carbide substrate.

By forming such a common drain electrode, the structure and the producing process of the semiconductor device can be simplified.

The first and second MOSFETs preferably include a wiring layer connecting the first and second MOSFETs on the front surface of the silicon carbide substrate.

The producing process of the semiconductor device can be made simpler than that of forming an additional wire such as a bonding wire or the like.

The present invention also provides a semiconductor device characterized in that the first MOSFET is a vertical MOSFET including the silicon carbide substrate of the first conductivity type; a body region of second conductivity type formed on the front side of the silicon carbide substrate; and a doped region of first conductivity type formed in the body region, and the second MOSFET is a vertical MOSFET including the silicon carbide substrate of first conductivity type; a body region of second conductivity type formed on the back side of the silicon carbide substrate; and a doped region of first conductivity type formed in the body region, wherein the current flowing between the silicon carbide substrate and the doped region is controlled by a gate electrode formed on the body region in the each vertical MOSFET.

According to the present invention, two vertical MOSFETs described above can be formed on the same silicon carbide substrate.

The silicon carbide substrate of the first MOSFET may include a region with high concentration of first conductivity type impurities in the back side of the substrate, and the silicon carbide substrate of the second MOSFET may include a region with high concentration of first conductivity type impurities in the front side of the substrate.

Good ohmic contact can be obtained between the silicon carbide substrate and the drain electrode by forming such regions with impurities of high concentration.

Each of the first and second MOSFETs may be a power MOSFET having a vertical structure.

The present invention also provides a semiconductor device characterized in that the first MOSFET is a vertical MOSFET including the silicon carbide substrate of the first conductivity type; a body region of second conductivity type formed on the front side of the silicon carbide substrate; and a doped region of first conductivity type formed in the body region, and the second MOSFET is a vertical MOSFET including the silicon carbide substrate of second conductivity type; source and drain regions of first conductivity type formed on the front side of the silicon carbide substrate, wherein, in the first MOSFET, the current flowing between the silicon carbide substrate and the doped region is controlled by a gate electrode formed on the body region, and, in the second MOSFET, the current flowing between the source region and the drain region is controlled by a gate electrode.

According to the present invention, the vertical and lateral MOSFETs described above can be formed on the same silicon carbide substrate.

The second MOSFET is preferably a lateral MOSFET having LDD structure.

DETAILED DESCRIPTION OF THE PREFERRED EMBODIMENTS

Embodiment 1

Figure 1:
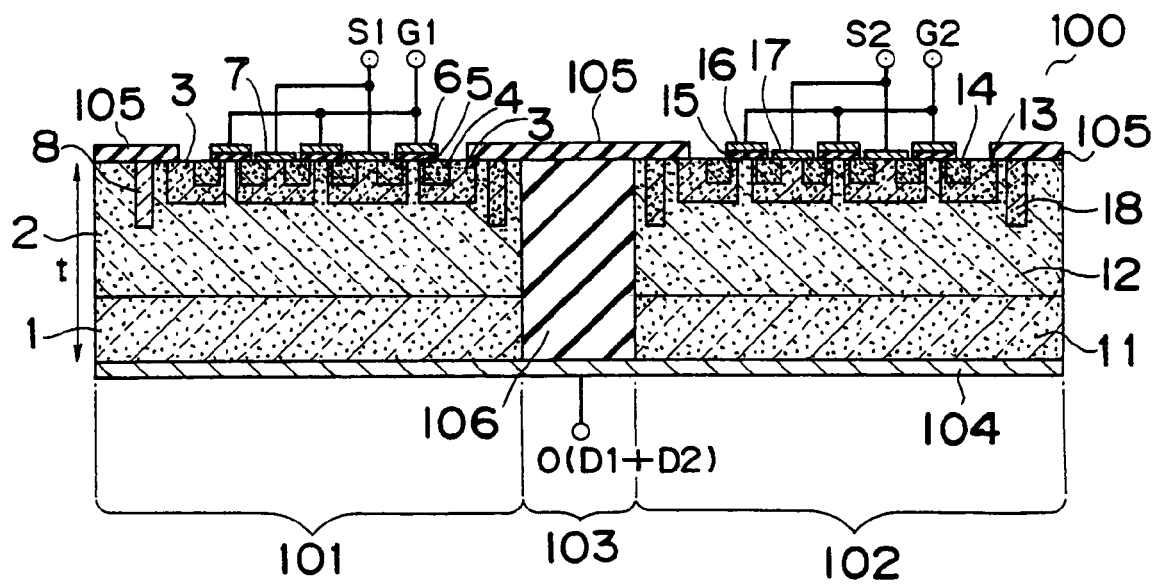
FIG. 1 is a cross-sectional view of the power semiconductor device according to the first embodiment of the present invention.

FIG. 1 shows a cross-sectional view of a power semiconductor device of the first embodiment according to the present invention, indicated generally at 100. The power semiconductor device 100 has an n-channel MOSFET 101 and a p-channel MOSFET 102, both formed on a silicon carbide (SiC) substrate. Each of these MOSFETs is a power MOSFET, which has a vertical structure having source and drain electrodes formed on the opposite surfaces of the MOSFET, respectively. The vertical power MOSFET includes DMOS (Double diffused MOS) type FET, VMOS (V-shaped gate MOS) type FET, and UMOS (U-shaped gate MOS) type FET, for example. The MOSFET 101 and MOSFET 102 are isolated from each other by an isolating region 103. In this case, each of the MOSFET 101 and 102 is an enhancement type MOSFET.

In the n-channel MOSFET 101, an n⁻ SiC layer 2 is formed in an n⁺ SiC layer 1. A plurality of p SiC body regions 3 are formed in the n⁻ SiC layer 2, and an n SiC doped region 4 is formed in the p SiC body region 3.

A gate electrode 6 is formed on the p SiC body region 3, which is provided between the n⁻ SiC layer 2 and the n SiC doped region 4, through an insulating film 5 made of silicon oxide or the like. The p SiC body region 3 under the gate electrode 6 functions as a channel region.

Also, a source electrode 7 is formed on the n SiC doped region 4. In addition, a p guard ring region 8 is formed around a plurality of p SiC body regions 3 so as to surround the p SiC body regions 3.

While the p-channel MOSFET 102 has the same structure as that of the n-channel MOSFET 101 except for the types of the impurities therein.

Namely, a p⁻ SiC layer 12, in which a plurality of n SiC body regions 13 are formed, is formed in a p⁺ SiC layer 11. Furthermore, a p SiC doped region 14 is formed in the n SiC body region 13. A gate electrode 16 is formed on the n SiC body region 13, which is provided between the p⁻ SiC layer 12 and the p SiC doped region 14, through an insulating film 15. A source electrode 17 is formed on the p SiC doped region 14. In addition, an n guard ring region 18 is formed around a plurality of p SiC body regions 13 so as to surround the p SiC body regions 13.

An isolating region 103, which is made of an insulating region 106 of silicon oxide or the like, is formed between the MOSFETs 101 and 102 to extend from the front surface to the back surface of the MOSFET, and isolates the MOSFETs 101 and 102 from each other. A drain electrode 104 which is common to the MOSFETs 101 and 102 is formed on the back surface of the MOSFETs 101 and 102. A protection film 105 made of silicon nitride or the like is partially formed on the front surface of the MOSFETs 101 and 102.

Because the MOSFETs 101 and 102 are made of SiC, the breakdown voltage of the pn junction between the n⁻ SiC layer 2 and the p SiC body region 3, and that of the pn junction between the p⁻ SiC layer 12 and the n SiC body region 13 are about ten times that of the MOSFET 200 using a silicon substrate. Furthermore, the band gaps of the MOSFETs 101 and 102 range from twice to three times that of the MOSFET 200 using silicon substrate, respectively. Consequently, the breakdown voltage of the pn junctions are maintained as large as that of the MOSFET 200, even if the thickness t of the MOSFETs 101 and 102 becomes sufficiently smaller than that of the MOSFET 200. In this case, the thickness t is about 10 μm, which is about one-fiftieth times that of the MOSFET 200.

Next, the producing method of the power semiconductor device is shortly described.

First, a non-doped SiC substrate is prepared. Then, a non-doped SiC layer having a thickness of t is formed on the SiC substrate using epitaxial technique.

Next, the $n^+$ SiC layer 1 and the $n^-$ SiC layer 2 are formed in a fabrication region of the n-channel MOSFET 101 by ion implantation method using nitride as dopants, for example. Similarly, the $p^+$ SiC layer 11 and the $p^-$ SiC layer 12 are formed in a fabrication region of the p-channel MOSFET 102 by ion implantation method using boron as dopants, for example.

Next, the drain electrode 104 is formed on the back surface of the non-doped SiC substrate.

Next, the trench is formed between the MOSFETs 101 and 102 by lithography technique and dry etching technique. The trench is bored from the front surface of the MOSFETs 101 and 102 so that the drain electrode 104 is exposed. For example, the width of the trench (the distance between the two MOSFETs) is 100 μm, and the depth is 10 μm. Then, the insulating region 106 of silicon oxide or the like is formed by thermal CVD method to fill the trench. Consequently, the isolating region 103 is formed between the MOSFETs 101 and 102.

As described above, according to the embodiment 1, the thickness of the MOSFETs 101 and 102 can be made about one-tenth that of a MOSFET using a silicon substrate. This is because the MOSFETs 101 and 102 are formed on a SiC substrate instead of a silicon substrate. Consequently, the aspect ratio of the trench is so small that the formation of the trench becomes easier than that of using a silicon substrate.

Next, the p SiC body region 3, the n SiC doped region 4, the n SiC body region 13, and the p SiC doped region 14 are formed by ion implantation technique. Furthermore, the gate electrodes 6 and 16, the drain electrodes 7 and 17, a wiring layer (not shown) or the like are formed. Hereby, the power semiconductor device 100 including the n-channel MOSFET 101 and the p-channel MOSFET 102 integrated in the same SiC substrate is completed.

It should be noted that a non-doped SiC substrate having a thickness of t may be used instead of the non-doped SiC substrate with non-doped SiC layer grown thereon and having a total thickness of t.

Figure 2:
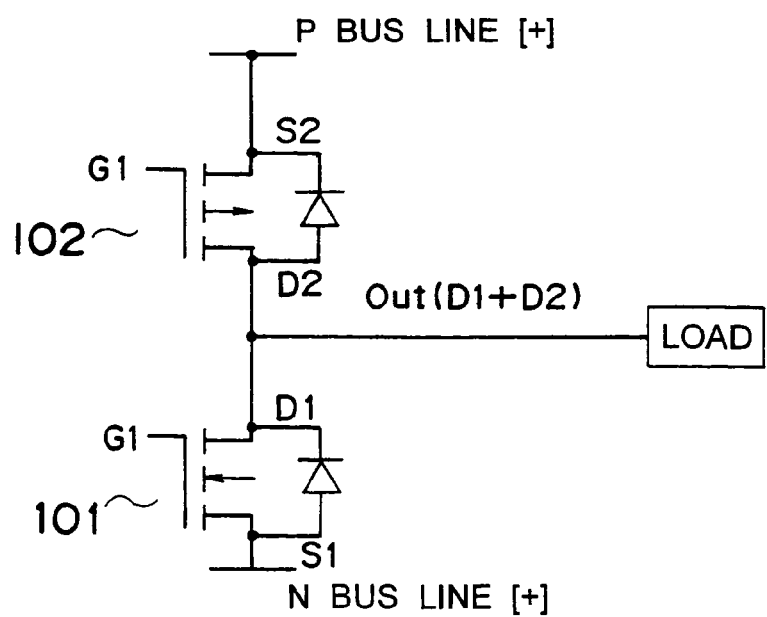
FIG. 2 is a circuit diagram of the power semiconductor device according to the first embodiment of the present invention.

FIG. 2 is a circuit diagram of the power semiconductor device 100 shown in FIG. 1.

In the power semiconductor device 100, the p-channel MOSFET 102 is used as an upper arm switching element, and the n-channel MOSFET 101 is used as a lower arm switching element.

The source S2 of the p-channel MOSFET 102 is connected to the P bus line, and the S1 of the n-channel MOSFET 101 is connected to the N bus line, respectively. Both of the D1 and D2 are connected to the external load. The gate G1 of the MOSFET 101 and the gate G2 of the MOSFET 102 turn on alternately, so that the load is connected to the N or P bus line alternately. Control signals may be separately transmitted to the G1 and G2. Also, one control signal may be transmitted to the complementary MOS (C-MOS) with the gate G1 and gate G2. A parasitic diode is used as a free wheeling diode (FwDi) formed between the source and the drain of the MOSFET.

By using three MOSFETs 100, for example, a phase switch for a three-phase-inverter can be obtained.

Embodiment 2

Figure 3:
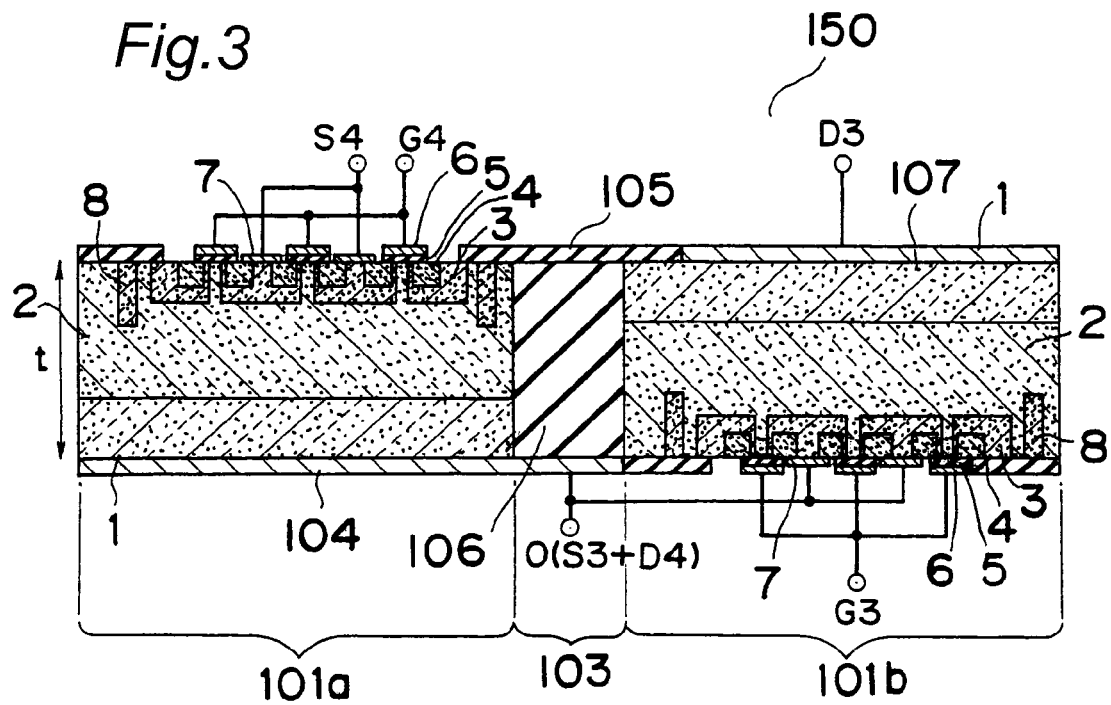
FIG. 3 is a cross-sectional view of the power semiconductor device according to the second embodiment of the present invention.

FIG. 3 shows a cross-sectional view of a power semiconductor device of the second embodiment according to the present invention, indicated generally at 150, where the numerals which are identical with those of FIG. 1 denote identical or corresponding components.

The power semiconductor device 150 has two n-channel MOSFETs 101a and 101b, both formed on a silicon carbide (SiC) substrate. Each of the MOSFETs 101a and 101b is a vertical power MOSFET having high power output.

As shown in FIG. 3, the MOSFET 101a has the front surface on which elements are formed and the back surface on which a drain electrode 104 is formed. On the other hand, MOSFET 101b has the back surface on which elements are formed and the front surface on which a drain electrode 107 is formed. The MOSFETs 101a and 101b are electrically isolated from each other by an isolating region 103.

In the producing method of the power semiconductor device 150, a non-doped SiC substrate having a thickness of t is prepared first. After the drain electrode 104 is formed on the substrate, the isolating region 103 is formed by the same method as described in Embodiment 1.

Next, n type ions are implanted into a MOSFET 101a fabrication region through the front surface of the substrate to form an $n^+$ SiC layer 1, while n type ions are implanted into a MOSFET 101b fabrication region through the back surface of the substrate to form an $n^-$ SiC layer 2.

Next, a p SiC body region 3, an n SiC doped region 4, a gate electrode 6, a source electrode 7 or the like are formed by the same method as described in Embodiment 1, then the power semiconductor device 150 is completed.

The thickness t of the power semiconductor device 150 is about 10 μm, allowing that the isolating region 103 can be formed easily.

Figure 4:
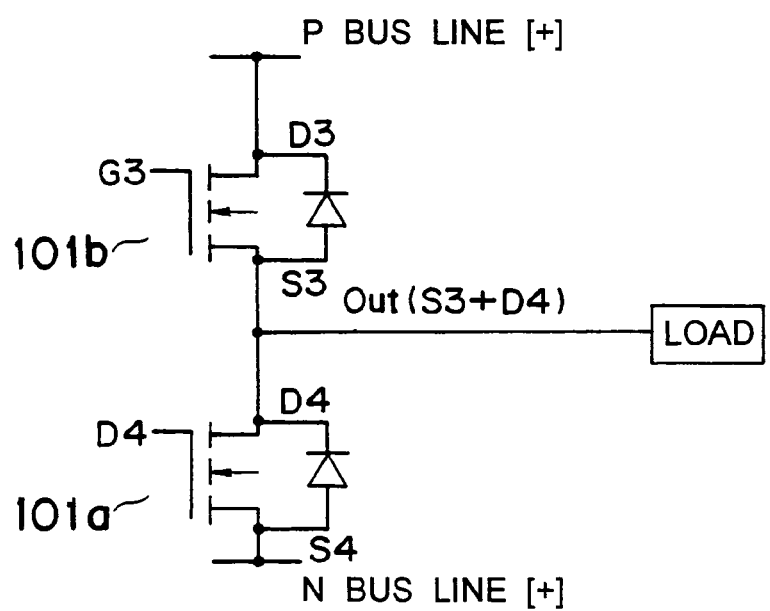
FIG. 4 is a circuit diagram of the power semiconductor device according to the second embodiment of the present invention.

FIG. 4 is a circuit diagram of the power semiconductor device 150 shown in FIG. 3.

In the power semiconductor device 150, the n-channel MOSFET 101b is used as an upper arm switching element, and the n-channel MOSFET 101a is used as a lower arm switching element. Each of the MOSFETs 101a and 101b is an enhancement type FET.

The drain D3 of the n-channel MOSFET 101b is connected to the P bus line, and the S4 of the n-channel MOSFET 101a is connected to the N bus line, respectively. Both of the S3 and D4 are connected to the external load. The gate G4 of the MOSFET 101a and the gate G3 of the MOSFET 101b turn on alternately, so that the load is connected to the N or P bus line alternately. A parasitic diode is used as a free wheeling diode (FwDi) like the circuit diagram shown in FIG. 2.

Embodiment 3

Figure 5:
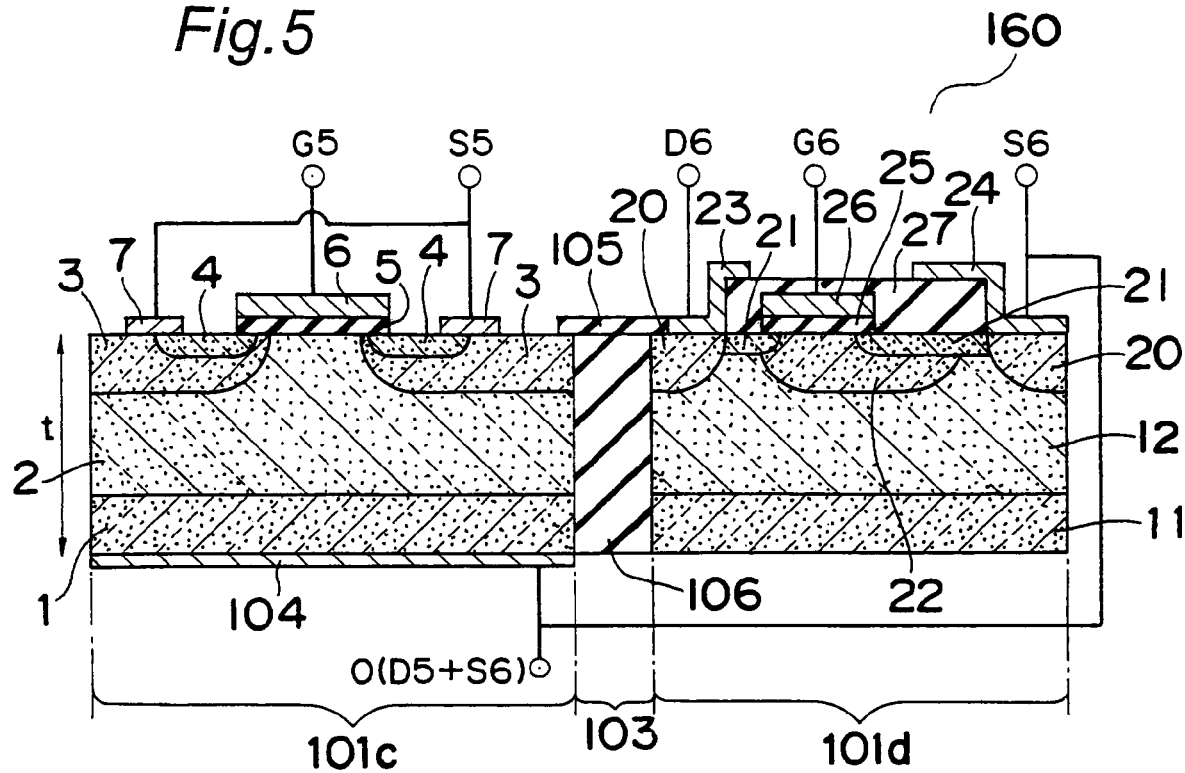
FIG. 5 is a cross-sectional view of the power semiconductor device according to the third embodiment of the present invention.
Figure 6:
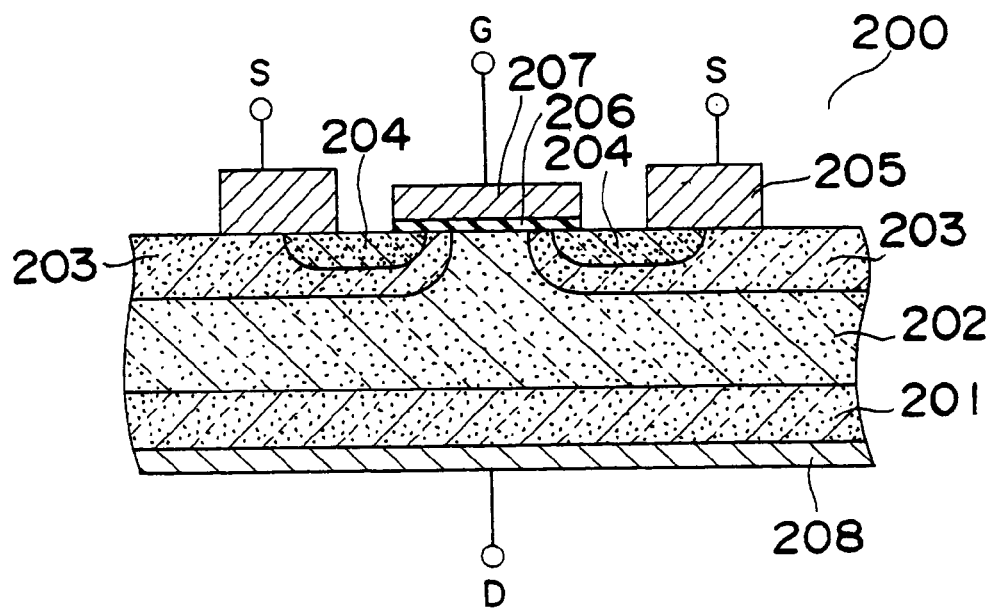
FIG. 6 is a cross-sectional view of the conventional vertical power MOSFET.

FIG. 5 shows a cross-sectional view of a power semiconductor device of the third embodiment according to the present invention, indicated generally at 160, where the numerals which are identical with those of FIG. 1 denote identical or corresponding components.

The power semiconductor device 160 has two n-channel MOSFETs 101c and 101d, both formed on a silicon carbide substrate. The MOSFET 101c is a vertical power MOSFET having high power output, and the MOSFET 101d is a lateral MOSFET having an offset gate.

Referring to the n-channel MOSFET 101c, an $n^-$ SiC layer 2 is formed in an $n^+$ SiC layer 1. A plurality of p SiC body regions 3 are formed in the $n^-$ SiC layer 2, and an n SiC doped region 4 is formed in the p SiC body region 3.

A gate electrode 6 is formed on the p SiC body region 3, which is provided between the n⁻ SiC layer 2 and the n SiC doped region 4, through an insulating film 5 made of silicon oxide or the like. The p SiC body region 3 under the gate electrode 6 functions as a channel region. Also, a source electrode 7 is formed on the n SiC doped region 4, and a drain electrode 104 is formed on the back surface of the n⁺ SiC layer 1.

On the other hand, in the offset-gate-type MOSFET 101d, a p⁻ SiC layer 12 is formed in a p⁺ SiC layer 11. N⁺ SiC source/drain regions 20 and n⁺ SiC regions 21 are formed in the p⁻ SiC layer 12 so that these regions construct LDD structure. A p⁺ SiC region 22 is formed between the n⁺ regions 21.

A gate electrode 26 is formed on the p⁺ SiC region 22 through an insulating film 25 made of silicon oxide or the like, on which an insulating film 27 made of silicon oxide or the like is formed. Also, a drain electrode 23 and a source electrode 24 are formed on the n⁺ SiC source/drain regions 20, respectively.

An isolating region 103, which is made of an insulating region 106 of silicon oxide or the like, is formed between the MOSFETs 101c and 101d to extend from the front surface to the back surface of the MOSFETs, isolating the MOSFETs 101c and 101d from each other. A protection film 105 made of silicon nitride or the like is partially formed on the surface of the MOSFETs 101c and 10d.

In the producing method of the power semiconductor device 160, a non-doped SiC substrate is prepared first. Then, an non-doped SiC layer having a thickness of t is formed on the SiC substrate using epitaxial technique.

Next, the n⁺ SiC layer 1 and the n⁻ SiC layer 2 are formed in a fabrication region of the n-channel MOSFET 101 by ion implantation method using nitride as dopants, for example. Similarly, an p⁺ SiC layer 11 and the p⁻ SiC layer 12 are formed in a fabrication region of the p-channel MOSFET 102 by ion implantation method using boron as dopants, for example.

Next, the drain electrode 104 is formed on the back surface of the non-doped SiC substrate. Then, the isolating region 103, which is made of the insulating region 106 of silicon oxide or the like, is formed between the MOSFETs 101c and 101d.

Next, the MOSFET 101c is formed by the same method as described in Embodiment 1. Then, the MOSFET 101d is formed by a well-known method used for fabricating a lateral MOSFET having LDD structure.

As described above, according to the Embodiment 3, a thickness of the MOSFETs 101c and 101d can be about one-tenth that of MOSFETs using a silicon substrate, because the MOSFETs 101c and 101d are formed on a SiC substrate instead of a silicon substrate. Consequently, the aspect ratio of the trench is so small that the formation of the trench becomes easier than that of using a silicon substrate.

It should be noted that a non-doped SiC substrate having a thickness of t may be used instead of the non-doped SiC substrate with non-doped SiC layer grown thereon and having a total thickness of t.

INDUSTRIAL APPLICABILITY

The present invention provides a power semiconductor device having a plurality of vertical power MOSFETs, and is used as a phase switching element for a high voltage and/or high current inverter.

The invention claimed is:

1. A semiconductor device, comprising:
a silicon carbide substrate having front and back surfaces facing each other and including a first silicon carbide substrate region and a second silicon carbide substrate region separate from said first silicon carbide substrate region;
a unitary solid isolating region having a substantially uniform composition and a substantially uniform width disposed within said silicon carbide substrate and directly connecting the first silicon carbide substrate region to the second silicon carbide substrate regions so that the first and second silicon carbide substrate regions are not in contact with each other; and
first and second MOSFETs formed on opposite sides of the solid isolating region, respectively, wherein
the first MOSFET is a first vertical MOSFET comprising
a first vertical MOSFET silicon carbide substrate region of a first conductivity type;
a first vertical MOSFET body region of a second conductivity type formed on the front side of the silicon carbide substrate;
a first vertical MOSFET gate electrode; and
a first vertical MOSFET doped region of the first conductivity type formed in the first vertical MOSFET body region, and
the second MOSFET is a second vertical MOSFET comprising
a second vertical MOSFET silicon carbide substrate region of the first conductivity type;
a second vertical MOSFET body region of the second conductivity type formed on the back side of the silicon carbide substrate;
a first vertical MOSFET gate electrode; and
a second vertical MOSFET doped region of the first conductivity type formed in the second vertical MOSFET body region, wherein
in each of the first and second vertical MOSFET, a current flowing between the respective silicon carbide substrate region and doped region is controlled by the respective MOSFET gate electrode.

2. The semiconductor device according to claim 1, wherein
the first vertical MOSFET silicon carbide substrate region further comprises a region with high concentration of first conductivity type impurities in the back side of the silicon carbide substrate, and
the second vertical MOSFET silicon carbide substrate region further comprises a region with high concentration of first conductivity type impurities in the front side of the silicon carbide substrate.

3. A semiconductor device, comprising:
a silicon carbide substrate having front and back surfaces facing each other and including a first silicon carbide substrate region and a second silicon carbide substrate region separate from said first silicon carbide substrate region;
a unitary solid isolating region having a substantially uniform composition and a substantially uniform width disposed within said silicon carbide substrate and directly connecting the first silicon carbide substrate region to the second silicon carbide substrate regions so that the first and second silicon carbide substrate regions are not in contact with each other; and
first and second MOSFETs formed on opposite sides of the solid isolating region, respectively, wherein the first MOSFET is a first vertical MOSFET comprising
- a first vertical MOSFET silicon carbide substrate region of a first conductivity type;
- a first vertical MOSFET body region of a second conductivity type formed on the front side of the silicon carbide substrate;
- a first vertical MOSFET gate electrode formed on the first vertical MOSFET body region; and
- a first vertical MOSFET doped region of the first conductivity type formed in the first vertical MOSFET body region, and the second MOSFET comprising
- a second MOSFET silicon carbide substrate region of the second conductivity type;
- source and drain regions of the first conductivity type formed on the front side of the silicon carbide substrate; and
- a second MOSFET gate electrode, wherein,
- in the first vertical MOSFET, a current flowing between the first vertical MOSFET silicon carbide substrate region and the first vertical MOSFET doped region is controlled by the gate electrode, and
- in the second MOSFET, a current flowing between the source region and the drain region is controlled by the second MOSFET gate electrode.

4. The semiconductor device according to claim 3, wherein the second MOSFET is a lateral MOSFET having a LDD structure.

* * * * *